US012764880B2

(12) United States Patent
Hasumi

(10) Patent No.: US 12,764,880 B2
(45) Date of Patent: Oct. 13, 2026

(54) CONTROL BOARD

(71) Applicant: TMEIC Corporation, Tokyo (JP)

(72) Inventor: Satoshi Hasumi, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 0 days.

(21) Appl. No.: 18/840,978

(22) PCT Filed: Jan. 18, 2023

(86) PCT No.: PCT/JP2023/001339
§ 371 (c)(1),
(2) Date: Aug. 23, 2024

(87) PCT Pub. No.: WO2024/154254
PCT Pub. Date: Jul. 25, 2024

(65) Prior Publication Data
US 2026/0006736 A1 Jan. 1, 2026

(51) Int. Cl.
*H05K 5/02* (2006.01)
*H05K 5/00* (2006.01)
*H05K 5/03* (2006.01)

(52) U.S. Cl.
CPC ......... *H05K 5/0234* (2013.01); *H05K 5/0056* (2013.01); *H05K 5/0256* (2013.01); *H05K 5/03* (2013.01)

(58) Field of Classification Search
CPC ....... H05K 5/0234; H05K 5/0256; H02B 1/36
See application file for complete search history.

(56) References Cited

U.S. PATENT DOCUMENTS

2019/0297749 A1* 9/2019 Bernardin ............ H05K 7/1492
2023/0384805 A1* 11/2023 Jeong ..................... H02K 11/30

FOREIGN PATENT DOCUMENTS

JP 2002-240726 A 8/2002
JP 2004-235177 A 8/2004
(Continued)

OTHER PUBLICATIONS

International Search Report issued Mar. 20, 2023 in PCT/JP2023/001339, filed on Jan. 18, 2023, citing document 16 therein, 4 pages (with English translation).
(Continued)

*Primary Examiner* — Sherman Ng
(74) *Attorney, Agent, or Firm* — Knobbe, Martens, Olson & Bear, LLP

(57) ABSTRACT

A control board (1) of an embodiment includes: a housing (2); a unit (10) that is provided on a base panel (3) in the housing; a caster (19) that is provided on a bottom portion (10*d*) of the unit and is capable of traveling on the base panel; an upper portion fixation panel (17) that fixes a backside upper end (10*fu*) of the unit at a time of storing the unit; a guide groove (32) that regulates a movement of the caster such that the unit is lowered to a fixation position toward a back side at the time of storing the unit; and a unit fixation portion (14) that fixes a backside lower end (10*fd*) of the unit when an entire lower surface region of the unit comes into contact with the base panel. Thereby, the control board is provided which is capable of improving a fixation performance of the unit to the housing, preventing a component inside the unit, and an electric conductor, a cable, or the like that is connected from being damaged, and improving ease and workability in taking the unit in and out of the housing.

5 Claims, 12 Drawing Sheets

(56) References Cited

FOREIGN PATENT DOCUMENTS

| | | | |
|---|---|---|---|
| JP | 2008-272279 | A | 11/2008 |
| JP | 2009-029239 | A | 2/2009 |
| JP | 2010-183711 | A | 8/2010 |

OTHER PUBLICATIONS

Office Action issued in Indian Application No. 202417063888, dated Aug. 13, 2026.

* cited by examiner

CONTROL BOARD

TECHNICAL FIELD

An embodiment of the present invention relates to a control board.

BACKGROUND

For example, a control board of an electric power conversion device has many control substrates, electric items (items), and the like. The substrates, the items, and the like are stored in a housing. The substrates, the items, and the like form a unit configuration. The unit is formed to be capable of being drawn from the housing. Such an example is described in Patent Document 1.

However, in an electric power conversion device, a rear portion of the unit may not be fixed by a bolt at the inside of the housing. When the fixation of the unit to the housing is insufficient, a component inside the unit, and an electric conductor, a cable, or the like connected to the unit may be damaged by vibration generated during transportation, during device operation, or the like.

Further, the substrates, the items, and the like are heavy. Therefore, the unit is fixed to the housing. There is a possibility of improving ease and workability in taking the unit in and out of the housing. At the same time, there is a possibility of shortening working hours in taking the unit in and out of the housing.

In view of the foregoing, the present invention is intended to achieve an object of improving a fixation performance of a unit to a housing, and in attaching the unit to the housing, improving ease, improving workability, shortening working hours, and providing a configuration corresponding to a flexible item arrangement.

RELATED ART DOCUMENTS

Patent Documents

[Patent Document 1]
Japanese Unexamined Patent Application, First Publication No. 2010-183711

SUMMARY OF INVENTION

Problems to be Solved by the Invention

A problem to be solved by the present invention is to provide a control board capable of improving a fixation performance of a unit to a housing, preventing a component inside the unit, and an electric conductor, a cable, or the like connected to the unit from being damaged, and improving ease and workability in taking the unit in and out of the housing.

Means for Solving the Problem

A control board of an embodiment includes a housing, a unit, a caster, an upper portion fixation panel, a guide groove, and a unit fixation portion. The unit is provided on a base panel in the housing. The caster is provided on a bottom portion of the unit and is capable of traveling on the base panel. The upper portion fixation panel fixes a backside upper end of the unit at a time of storing the unit. The guide groove regulates a movement of the caster such that the unit is lowered to a fixation position toward a back side at the time of storing the unit. The unit fixation portion fixes a backside lower end of the unit when an entire lower surface region of the unit comes into contact with the base panel.

DESCRIPTION OF THE EMBODIMENTS

Hereinafter, a control board of an embodiment will be described with reference to the drawings.

Figure 1:
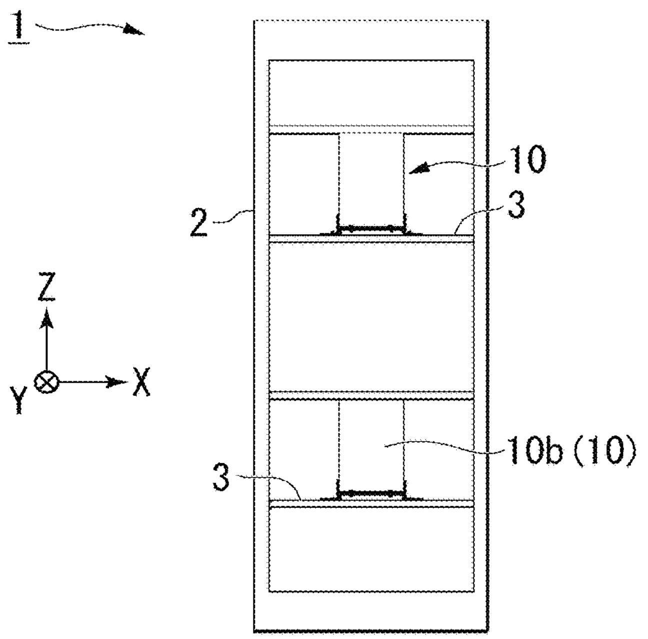
FIG. 1 is a front view showing a control board of an embodiment.

FIG. 1 is a front view showing a control board in an embodiment. In the drawing, reference numeral 1 represents the control board.

Hereinafter, each axis direction of the X-axis, the Y-axis, and the Z-axis orthogonal to one another in a three-dimensional space is a direction parallel to each axis of the control board. For example, as shown in FIG. 1, the X-axis direction is parallel to a rightward-leftward direction of the control board 1. The Y-axis direction is parallel to a forward-rearward direction of the control board 1. The Z-axis direction is parallel to an upward-downward direction of the control board 1.

The control board 1 according to the embodiment is provided in an electric facility or the like. The control board 1 is a switchboard, a distribution board, and the like that constitute an electric power conversion device, an electric power supply device, a motor drive device, and the like.

The control board 1 has a housing 2 and a unit 10 as shown in FIG. 1.

A front of the housing 2 opens. The housing 2 includes an opening-closing door (not shown) that opens and closes the opening. The housing 2 includes a plurality of base panels (shelf plates) 3. The inside of the housing 2 is divided into a plurality of stages by the base panels 3. The base panel 3 located at a lowest position may match a bottom portion of the housing 2.

The base panel 3 is arranged at the inside of the housing 2. The base panels 3 are attached to the housing 2. The base panels 3 are fixed to the housing 2. The base panels 3 are spaced from each other in an upward-downward direction. The base panels 3 are parallel to each other. The base panels 3 have the same contour shape as each other. All of the base panels 3 are horizontally arranged. The plurality of base panels 3 partition the inside of the housing 2 in the upward-downward direction.

The unit 10 can be placed on the base panel 3. It is also possible not to place the unit 10 on the base panel 3 depending on an item stored in the housing 2.

Figure 2:
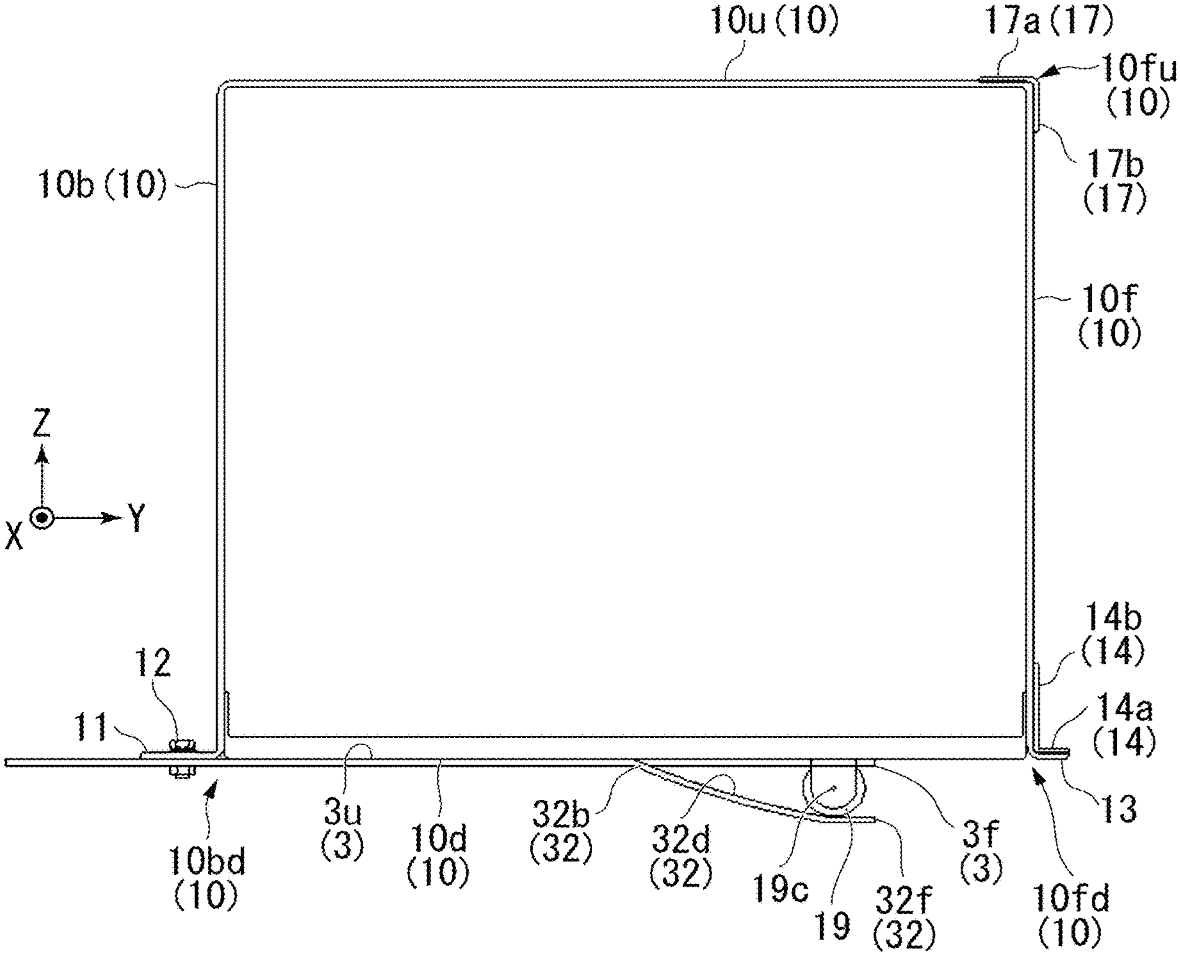
FIG. 2 is a side view showing a storage state of a unit in a housing in the control board of the embodiment.
Figure 3:
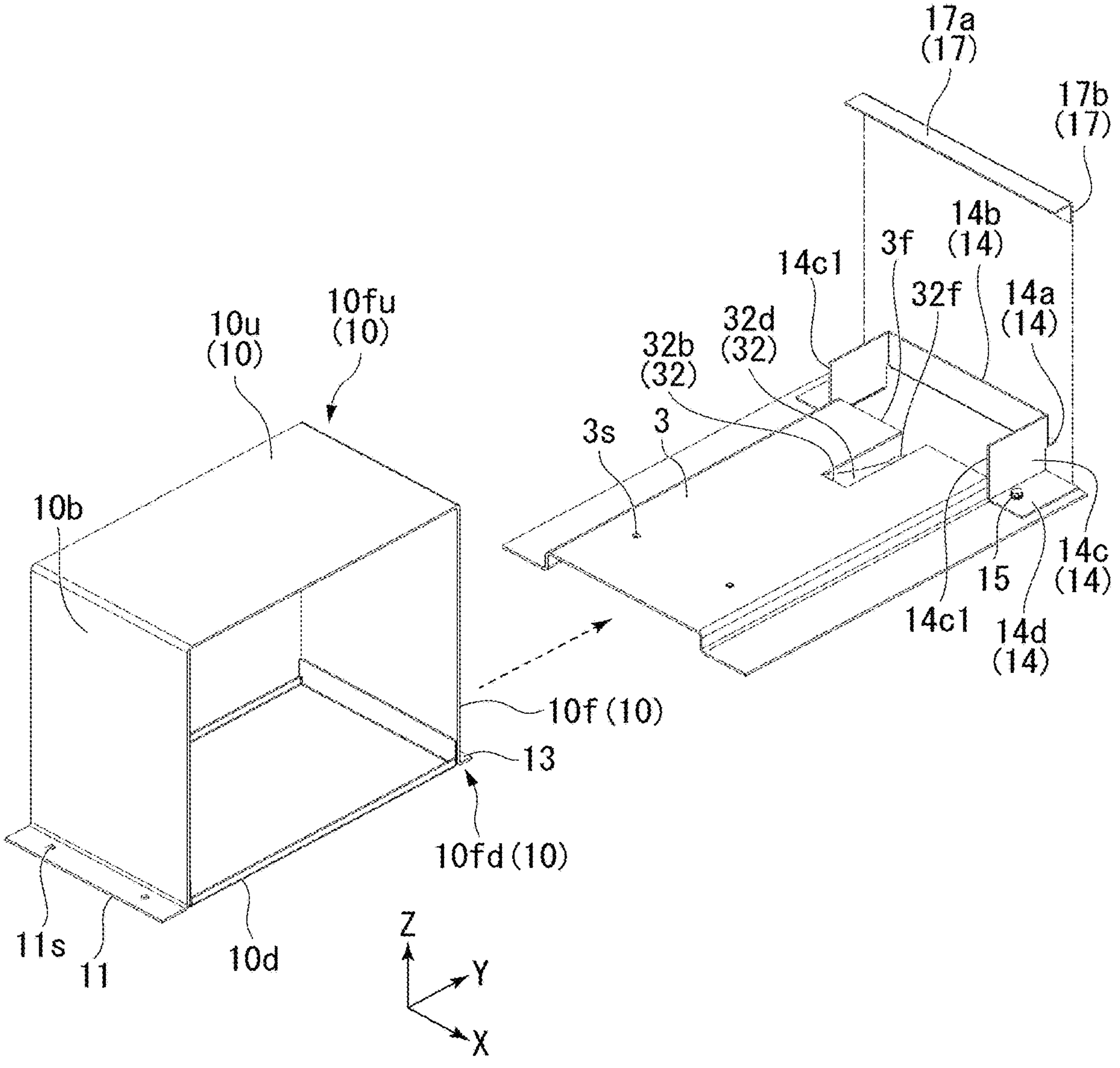
FIG. 3 is a perspective view showing a unit before being stored, a base panel, and the like in the control board of the embodiment.

When the unit 10 is placed on the base panel 3, the housing 2 includes a back position regulation portion 14 and an upper portion fixation panel 17 (refer to FIG. 2 and FIG. 3). The back position regulation portion 14 and the upper portion fixation panel 17 are described later.

The unit 10 is stored inside the housing 2. The unit 10 is placed on the base panel 3 in a state of being stored in the housing 2. The unit 10 is moved in a Y-direction when being stored in the inside from the outside of the housing 2. The unit 10 can be drawn to the outside from the inside of the housing 2. The unit 10 is moved in the Y-direction when being drawn to the outside from the inside of the housing 2.

A plurality of electric devices (items) and a plurality of circuit components (items) are stored in the inside of the unit 10. Some electrical components (items) are connected to the outside by a wiring. The unit 10 includes a wiring connected to the outside.

The unit 10 has a rectangular contour shape when seen in an X-direction. The unit 10 has a rectangular contour shape when seen in the Y-direction. The unit 10 has a rectangular contour shape when seen in a Z-direction. The unit 10 has a rectangular contour shape similar to that of the base panel 3 when seen in the Z-direction.

FIG. 2 is a side view showing a storage state of the unit in the housing in the embodiment.

As shown in FIG. 2, the unit 10 includes a unit front plate 10*b*, a unit upper plate 10*u*, a unit back plate 10*f*, and a unit lower plate (bottom portion) 10*d*. The unit back plate 10*f*, the unit upper plate 10*u*, the unit front plate 10*b*, and the unit lower plate 10*d* surround the inside in a rectangular form when seen in the X-direction.

The unit front plate 10*b* has a rectangular contour shape when seen in the Y-direction. An upper end of the unit front plate 10*b* is connected to the unit upper plate 10*u*. A lower end of the unit front plate 10*b* is connected to the unit lower plate 10*d*. The unit front plate 10*b* is exposed to a front side of the Y-direction in a state where the unit 10 is stored in the housing 2. The unit front plate 10*b* is exposed to a front of the housing 2 in which the opening-closing door is opened in a state where the unit 10 is stored in the housing 2.

The unit front plate 10*b* is provided to stand along a substantially perpendicular XZ plane in a state where the unit 10 is stored in the housing 2. When the unit 10 is stored in the housing 2, the unit front plate 10*b* is located on a rearward side in a movement direction of the unit 10. When the unit 10 is removed from the housing 2, the unit front plate 10*b* is located on a forward side in the movement direction of the unit 10. The XZ plane is a plane along the X-direction and the Z-direction.

The unit upper plate 10*u* has a rectangular contour shape when seen in the Z-direction. The unit upper plate 10*u* is connected to the unit front plate 10*b* at the front side of the housing 2. The unit upper plate 10*u* is connected to the unit back plate 10*f* at the backside of the housing 2. The unit upper plate 10*u* is the same size as that of the unit front plate 10*b* in the X-direction. The unit upper plate 10*u* is the same size as that of the unit back plate 10*f* in the X-direction. The unit upper plate 10*u* is a substantially horizontal XY plane in a state where the unit 10 is stored in the housing 2. The unit upper plate 10*u* is parallel to the base panel 3 in a state where the unit 10 is stored in the housing 2. The XY plane is a plane along the X-direction and the Y-direction.

The unit back plate 10*f* has a rectangular contour shape when seen in the Y-direction. The unit back plate 10*f* is substantially the same contour shape as that of the unit front plate 10*b* when seen in the Y-direction. An upper end of the unit back plate 10*f* is connected to the unit upper plate 10*u*. A lower end of the unit back plate 10*f* is connected to the unit lower plate 10*d*. The unit back plate 10*f* faces the back side of the housing 2 in a state where the unit 10 is stored in the housing 2. The unit back plate 10*f* is the same size as that of the unit front plate 10*b* in the X-direction.

The unit back plate 10*f* is the same size as that of the unit upper plate 10*u* in the X-direction. The unit back plate 10*f* is parallel to the unit front plate 10*b*. The unit back plate 10*f* is provided to stand along the substantially perpendicular XZ plane in a state where the unit 10 is stored in the housing 2. When the unit 10 is stored in the housing 2, the unit back plate 10*f* is located on a forward side in the movement direction of the unit 10. When the unit 10 is removed from the housing 2, the unit back plate 10*f* is located on a rearward side in the movement direction of the unit 10.

The unit lower plate 10*d* has a rectangular contour shape when seen in the Z-direction. The unit lower plate 10*d* is substantially the same contour shape as that of the unit upper plate 10*u* when seen in the Z-direction. The unit lower plate 10*d* is connected to the unit front plate 10*b* at the front side of the housing 2. The unit lower plate 10*d* is connected to the unit back plate 10*f* at the backside of the housing 2. The unit lower plate 10*d* is the same size as that of the unit front plate 10*b* in the X-direction. The unit lower plate 10*d* is the same size as that of the unit back plate 10*f* in the X-direction.

The unit lower plate 10*d* is a substantially horizontal XY plane in a state where the unit 10 is stored in the housing 2. The unit lower plate 10*d* is parallel to the base panel 3 when the unit 10 is stored in the housing 2. The unit lower plate 10*d* is in contact with the base panel 3 in a state where the unit 10 is stored in the housing 2. Both ends in the X-direction of the unit lower plate 10*d* may be bent upward along the Z-direction. It is possible to improve the strength of the unit lower plate 10*d* by bending both ends in the X-direction of the unit lower plate 10*d*.

The unit lower plate 10*d* extends to the back side beyond the base panel 3 in the X-direction in a state where the unit 10 is stored in the housing 2. The unit lower plate 10*d* protrudes from a back end portion 3*f* of the base panel 3 in a state where the unit 10 is stored in the housing 2. The back end portion 3*f* is parallel to a lower end of the unit back plate 10*f*. The back end portion 3*f* is closer to the unit back plate 10*f* than the middle of the unit lower plate 10*d* in the Y-direction in a state where the unit 10 is stored in the housing 2. The back end portion 3*f* may be closer to the unit back plate 10*f* than an intermediate position between the unit back plate 10*f* and the middle of the unit lower plate 10*d* in the Y-direction in a state where the unit 10 is stored in the housing 2.

A caster 19 described later is provided on a lower portion of the unit lower plate 10*d*.

The unit front plate 10*b* includes a front fixation plate 11 at a lower end. The front fixation plate 11 is formed along the XY plane. The front fixation plate 11 extends in the Y-direction. The front fixation plate 11 is flush with the unit lower plate 10*d*. The front fixation plate 11 is parallel to the unit lower plate 10*d*. The front fixation plate 11 extends rearward from the unit front plate 10*b* in the movement direction of the unit 10 when the unit 10 is stored in the housing 2. The front fixation plate 11 is the same size as that of the unit front plate 10*b* in the X-direction. The front fixation plate 11 is parallel to the base panel 3.

The front fixation plate 11 is fixed to the base panel 3. The front fixation plate 11 is fixed to the base panel 3 by a bolt 12. By fixing the front fixation plate 11, the unit 10 is fixed to the base panel 3. The front fixation plate 11 has a penetration portion 11*s* through which a coupling member (bolt) 12 penetrates (refer to FIG. 3). The base panel 3 has a penetration portion 3*s* through which the bolt 12 penetrates (refer to FIG. 3). The front fixation plate 11 may be formed by bending the lower end of the unit front plate 10*b*. The coupling member (bolt) 12 is not limited to a bolt and can also be another configuration.

The front fixation plate 11 can be moved from the base panel 3 by removing the bolt 12 when the unit 10 is removed from the housing 2. By releasing the fixation of the front fixation plate 11, the unit 10 can moved from the base panel 3.

The unit back plate 10*f* includes a back fixation plate (unit fixation portion) 13 at a lower end. The back fixation plate 13 is provided on a backside lower end 10*fd* of the unit 10. The back fixation plate 13 positions the backside lower end 10*fd* of the unit 10. The back fixation plate 13 is formed along the XY plane. The back fixation plate 13 extends in the Y-direction. The back fixation plate 13 is flush with the unit lower plate 10*d*. The back fixation plate 13 is parallel to the unit lower plate 10*d*. The back fixation plate 13 extends forward from the unit front plate 10*b* in the movement direction of the unit 10 when the unit 10 is stored in the housing 2. The back fixation plate 13 is the same size as that of the unit back plate 10*f* in the X-direction. The back fixation plate 13 is parallel to the base panel 3.

The back fixation plate 13 is in contact with the back position regulation portion (unit fixation portion) 14 in a state where the unit 10 is stored in the housing 2. The back position regulation portion (unit fixation portion) 14 is described later. The back fixation plate 13 may be formed by bending a lower end of the unit back plate 10*f*. The back fixation plate 13 is flush with the base panel 3 in a state where the unit 10 is stored in the housing 2. The back fixation plate 13 is not fixed by a bolt.

The back fixation plate 13 is elastically deformable.

The back fixation plate 13 comes into contact with the lower side of the back position regulation portion 14 when the unit 10 is stored in the housing 2. The back position regulation portion 14 is in contact with the backside lower end 10*fd* of the unit 10 in a state where the unit 10 is stored in the housing 2. The back position regulation portion 14 positions the backside lower end 10*fd* of the unit 10 when the unit 10 is stored in the housing 2. The back position regulation portion 14 pushes the contacting back fixation plate 13 from the upper side. A Z-direction position of the unit 10 with respect to the base panel 3 is regulated by the back position regulation portion 14 that pushes the back fixation plate 13 from the upper side and the base panel 3 that is in contact with the unit lower plate 10*d* from the lower side.

The back position regulation portion 14 is elastically deformable.

The back position regulation portion 14 includes a back upward-downward position regulation section 14*a* that extends in the Y-direction and a back forward-rearward position regulation section 14*b* that extends in the Z-direction. Each of the back upward-downward position regulation section 14*a* and the back forward-rearward position regulation section 14*b* is a plate body. A Y-direction end of the back upward-downward position regulation section 14*a* and a Z-direction end portion of the back forward-rearward position regulation section 14*b* are connected to each other. The back upward-downward position regulation section 14*a* and the back forward-rearward position regulation section 14*b* are formed by bending a single plate body.

The back upward-downward position regulation section 14*a* extends along a substantially horizontal XY plane. In the back upward-downward position regulation section 14*a*, in the Y-direction, an end that becomes a front side of the housing 2 is connected to the back forward-rearward position regulation section 14*b*. An end in the Y-direction of the back upward-downward position regulation section 14*a* is connected to the back forward-rearward position regulation section 14*b* in the entire length of the X-direction. The back upward-downward position regulation section 14*a* is spaced from the back end portion 3*f* in the Y-direction.

The back forward-rearward position regulation section 14*b* extends along a substantially perpendicular ZX plane. A lower end of the back forward-rearward position regulation section 14*b* is connected to the back upward-downward position regulation section 14*a* in the Z-direction. The back forward-rearward position regulation section 14*b* is in contact with a back end in the Y-direction of the unit 10 in a state where the unit 10 is stored in the housing 2. When the unit 10 is stored in the housing 2, the back forward-rearward position regulation section 14*b* comes into contact with the unit back plate 10*f* in the Y-direction. The back forward-rearward position regulation section 14*b* regulates a storage position of the unit 10 in the Y-direction.

FIG. 3 is a perspective view showing a unit before being stored, a base panel, and the like in the embodiment.

As shown in FIG. 3, each of both ends in the X-direction of the back position regulation portion 14 has a lateral position regulation section 14*c*.

The lateral position regulation section 14*c* is connected to both ends in the X-direction of the back forward-rearward position regulation section 14*b*. The lateral position regulation section 14*c* extends along a substantially perpendicular YZ plane. The lateral position regulation section 14*c* may be in contact with an end that becomes a front side of the housing 2 of the back upward-downward position regulation section 14*a*. An upper end of the lateral position regulation section 14*c* matches an upper end of the back forward-rearward position regulation section 14*b*. The lateral position regulation section 14*c* may be formed by bending both ends in the X-direction of the back forward-rearward position regulation section 14*b*. The lateral position regulation section 14*c* is in contact with both ends in the X-direction of the unit 10 in a state where the unit 10 is stored in the housing 2.

The lateral position regulation section 14*c* regulates a storage position of the unit 10 in the X-direction when the unit 10 is stored in the housing 2.

A spacing distance in the X-direction between the two lateral position regulation sections 14*c* is equal to an X-direction size of the unit 10. The spacing distance in the X-direction between the two lateral position regulation sections 14*c* may be slightly larger than the X-direction size of the unit 10. The spacing distance in the X-direction between the two lateral position regulation sections 14*c* is equal to an X-direction size of the unit back plate 10*f*. The spacing distance in the X-direction between the two lateral position regulation sections 14*c* may be slightly larger than the X-direction size of the unit back plate 10*f*.

The spacing distance in the X-direction between the two lateral position regulation sections 14*c* is equal to an X-direction size of the back fixation plate 13. The spacing distance in the X-direction between the two lateral position regulation sections 14*c* may be slightly larger than the X-direction size of the back fixation plate 13.

In the Y-direction, the lateral position regulation section 14*c* is located such that a front-side end 14*cl* which becomes a front side of the housing 2 is closer to a front side of the housing 2 than the back end portion 3*f* of the base panel 3. In the lateral position regulation section 14*c*, in the Y-direction, the front-side end 14*cl* which becomes the front side of the housing 2 may be formed at substantially the same position as the back end portion 3*f* of the base panel 3. In the lateral position regulation section 14*c*, in the Y-direction, the end which becomes the front side of the housing 2 may be located slightly further away from the front side of the housing 2 than the back end portion 3*f* of the base panel 3.

A lower end of the lateral position regulation section 14*c* is connected to a back position regulation fixation portion 14*d*.

The back position regulation fixation portion 14*d* is fixed to the base panel 3 by a bolt 15. The back position regulation portion 14 is fixed to the base panel 3 by fixing the back position regulation fixation portion 14*d*. The back position regulation fixation portion 14*d* is located further outward than both ends of the unit 10 in the X-direction in a state where the unit 10 is stored in the housing 2. The back position regulation fixation portion 14*d* extends along a substantially horizontal XY plane.

In the back position regulation fixation portion 14*d*, in the Y-direction, an end which becomes a front side of the housing 2 is formed at substantially the same position as the back end portion 3*f* of the base panel 3. In the back position regulation fixation portion 14*d*, in the Y-direction, the end which becomes the front side of the housing 2 may be located closer to the front side of the housing 2 than the back end portion 3*f* of the base panel 3. In the back position regulation fixation portion 14*d*, in the Y-direction, the end which becomes the front side of the housing 2 may be located further away from the front side of the housing 2 than the back end portion 3*f* of the base panel 3.

The upper portion fixation panel 17 is in contact with the unit 10 in a state where the unit 10 is stored in the housing 2. The upper portion fixation panel 17 is in contact with a backside upper end 10*fu* in a state where the unit 10 is stored in the housing 2. The upper portion fixation panel 17 positions the backside upper end 10*fu* when the unit 10 is stored in the housing 2. The upper portion fixation panel 17 positions the unit 10 when the unit 10 is stored in the housing 2. The backside upper end 10*fu* is in contact with a lower side of the upper portion fixation panel 17 in a state where the unit 10 is stored in the housing 2. In the upper portion fixation panel 17, the backside upper end 10*fu* is in contact with a front side of the housing 2 in the Y-direction in a state where the unit 10 is stored in the housing 2.

The upper portion fixation panel 17 is positioned relative to the base panel 3. Both ends in the X-direction of the upper portion fixation panel 17 are connected to the housing 2.

The upper portion fixation panel 17 is elastically deformable.

The upper portion fixation panel 17 regulates the position of the backside upper end 10*fu* when the unit 10 is stored in the housing 2 as described later. The upper portion fixation panel 17 is provided at a position with which the backside upper end 10*fu* of the unit 10 first comes into contact when the unit 10 is stored in the housing 2. The upper portion fixation panel 17 is provided at a position with which the backside upper end 10*fu* of the unit 10 first comes into contact when the unit 10 inclined such that a front-side lower end 10*bd* floats from the base panel 3 in the Y-direction is moved toward the backside in the Y-direction while being supported by the caster 19 described later when the unit 10 is stored in the housing 2.

The upper portion fixation panel 17 includes an upper upward-downward position regulation section 17*a* extending in the Y-direction and an upper forward-rearward position regulation section 17*b* extending in the Z-direction. Each of the upper upward-downward position regulation section 17*a* and the upper forward-rearward position regulation section 17*b* is a plate body. A Y-direction end of the upper upward-downward position regulation section 17*a* and a Z-direction end portion of the upper forward-rearward position regulation section 17*b* are connected to each other. The upper upward-downward position regulation section 17*a* and the upper forward-rearward position regulation section 17*b* are formed by bending a single plate body.

The upper upward-downward position regulation section 17*a* extends along a substantially horizontal XY plane. In the upper upward-downward position regulation section 17*a*, in the Y-direction, an end that becomes a backside of the housing 2 is connected to the upper forward-rearward position regulation section 17*b*. A backside end in the Y-direction of the upper upward-downward position regulation section 17*a* is connected to the upper forward-rearward position regulation section 17*b* in the entire length of the X-direction. A front-side end 17*a*1 in the Y-direction of the upper upward-downward position regulation section 17*a* extends along the X-direction in the entire length of the X-direction. The upper upward-downward position regulation section 17*a* is in contact with a back end of the unit upper plate 10*u* in a state where the unit 10 is stored in the housing 2. The front-side end 17*a*1 of the upper upward-downward position regulation section 17*a* comes into contact with the unit upper plate 10*u* when the unit 10 is stored in the housing 2 as described later.

The upper forward-rearward position regulation section 17*b* extends along a substantially perpendicular ZX plane. An upper end of the upper forward-rearward position regulation section 17*b* is connected to the upper upward-downward position regulation section 17*a* in the Z-direction. The upper forward-rearward position regulation section 17*b* is in contact with an upper end of the unit back plate 10*f* in a state where the unit 10 is stored in the housing 2. The upper forward-rearward position regulation section 17*b* regulates a storage position of the unit 10 in the Y-direction.

The caster 19 is provided on a lower portion of the unit lower plate 10*d*. The caster 19 protrudes downward from the unit lower plate 10*d*. The caster 19 is rotatable around a rotation shaft 19*c* extending in the X-direction in a state where the unit 10 is stored in the housing 2. The rotation shaft 19*c* is parallel to a ridge line of an angle portion at which the unit lower plate 10*d* and the unit back plate 10*f* are connected together. The rotation shaft 19*c* is parallel to a ridge line of an angle portion at which the unit lower plate 10*d* and the unit front plate 10*b* are connected together. The rotation shaft 19*c* is spaced downward in the Z-direction from the unit lower plate 10*d*.

The caster 19 is stored in a guide groove 32 described later in a state where the unit 10 is stored in the housing 2. The caster 19 protrudes downward from the base panel 3 in a state where the unit 10 is stored in the housing 2. The caster 19 is in contact with the guide groove 32 described later in a state where the unit 10 is stored in the housing 2. The caster 19 is located closer to the front side of the housing 2 than the back end portion 3*f* in a state where the unit 10 is stored in the housing 2.

The caster 19 travels on the base panel 3 when the unit 10 is stored in the housing 2. The caster 19 travels inside the guide groove 32 described later when the unit 10 is stored in the housing 2.

The caster 19 is arranged at the middle of the unit lower plate 10*d* in the X-direction. The caster 19 is arranged at a position corresponding to the guide groove 32 described later in the X-direction in a state where the unit 10 is stored in the housing 2. The caster 19 is arranged to be spaced from both ends of the unit lower plate 10*d* in the Y-direction. The caster 19 is arranged at the middle to be spaced by a long distance from both ends of the unit lower plate 10*d* in the X-direction.

The caster 19 is arranged at a position in the Y-direction such that the caster 19 is capable of traveling on the base panel 3 such that the unit 10 is inclined and the front-side lower end 10*bd* floats from the base panel 3 when the unit 10 is stored in the housing 2.

The caster 19 is provided at a position that matches a front groove end 32*b* of the guide groove 32 described later in the Y-direction when the unit 10 moves toward the backside in the Y-direction and the backside upper end 10*fu* of the unit 10 comes into contact with the upper portion fixation panel 17 when the unit 10 is stored in the housing 2.

The base panel 3 includes the guide groove 32. The guide groove 32 regulates the movement of the caster 19 when the unit 10 is moved toward the backside in the Y-direction when the unit 10 is stored in the housing 2. The guide groove 32 guides the movement of the caster 19. The guide groove 32 guides the movement of the unit 10. The guide groove 32 regulates the unit 10 such that the unit 10 lowers to a fixation position in the Z-direction in accordance with the movement in the Y-direction of the unit 10.

The guide groove 32 is spaced from the unit lower plate 10*d* in a state where the unit 10 is stored in the housing 2. In the base panel 3, a position around the guide groove 32 is in contact with the unit lower plate 10*d* in a state where the unit 10 is stored in the housing 2.

The guide groove 32 is provided on the base panel 3. The guide groove 32 extends in the Y-direction. The guide groove 32 is inclined from the front groove end 32*b* toward a back groove end 32*f* in the Y-direction. The guide groove 32 lowers from the front groove end 32*b* toward the back groove end 32*f* in the Y-direction.

The front groove end 32*b* is at the same height as the base panel 3 in the Z-direction. The back groove end 32*f* lowers from the base panel 3 by a height equal to a protrusion amount of the caster 19 protruding downward from the unit lower plate 10*d* in the Z-direction.

Both sides in the X-direction of the guide groove 32 open outward. In the guide groove 32, the back groove end 32*f* opens outward in the Y-direction. The back groove end 32*f* is formed at substantially the same position as the back end portion 3*f* of the base panel 3 in the Y-direction.

The guide groove 32 includes a bottom portion (bottom plate) 32*d*.

The bottom portion 32*d* is curved. The bottom portion 32*d* is formed in an arc form when seen in the X-direction. The bottom portion 32*d* is curved in an arc form around a position where the unit 10 is in contact with the upper portion fixation panel 17. The bottom portion 32*d* has a curve shape that lowers from the front groove end 32*b* toward the back groove end 32*f* around the position where the unit 10 is in contact with the upper portion fixation panel 17. The bottom portion 32*d* can be formed as a notch of the base panel 3.

The bottom portion 32*d* is inclined downward toward the back groove end 32*f* in the vicinity of the front groove end 32*b*. The bottom portion 32*d* extends in the Y-direction in the vicinity of the back groove end 32*f*. The entire length of the bottom portion 32*d* extends in the horizontal direction in the X-direction. That is, the bottom portion 32*d* is not inclined in the X-direction.

The bottom portion 32*d* has a plate form. In the bottom portion 32*d*, the front groove end 32*b* is connected to the base panel 3. The bottom portion 32*d* is integral with the base panel 3. The back groove end 32*f* is formed to be bent downward at the front groove end 32*b* from the base panel 3.

The guide groove 32 regulates the movement locus of the caster 19 such that the backside lower end 10*fd* of the unit 10 rotates toward the backside around a position in contact with the upper portion fixation panel 17.

Figure 4:
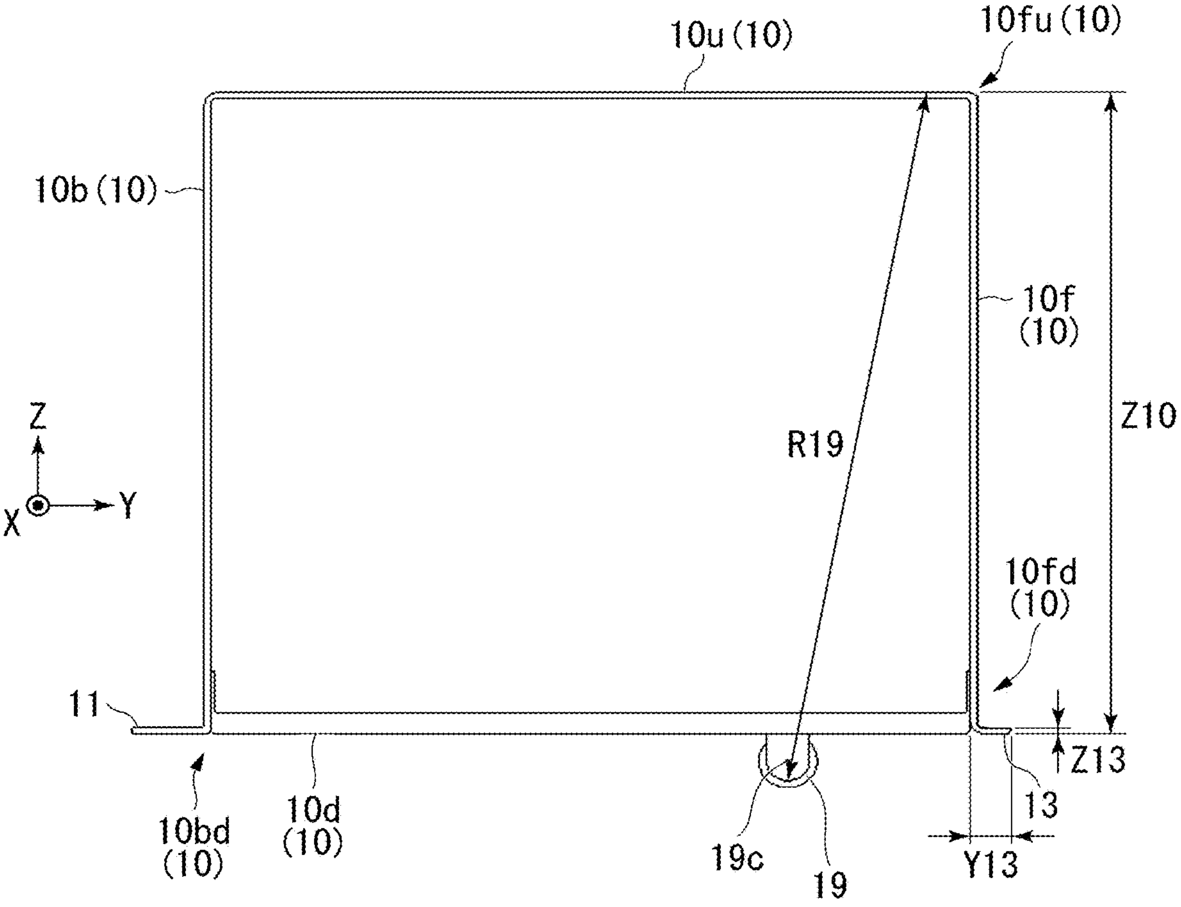
FIG. 4 is a side view showing a size and the like of the unit in the control board of the embodiment.
Figure 5:
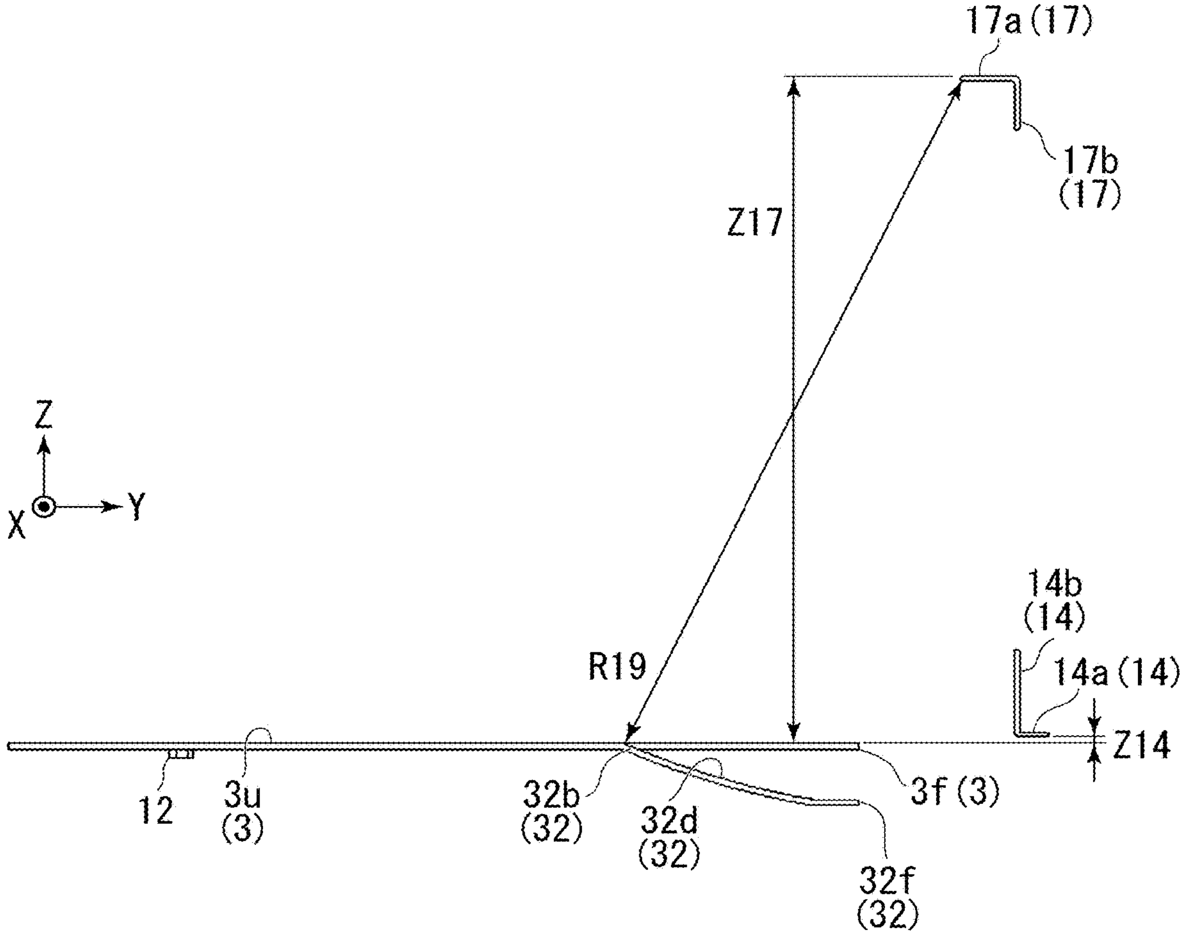
FIG. 5 is a side view showing a size and the like of the housing in the control board of the embodiment.
Figure 6:
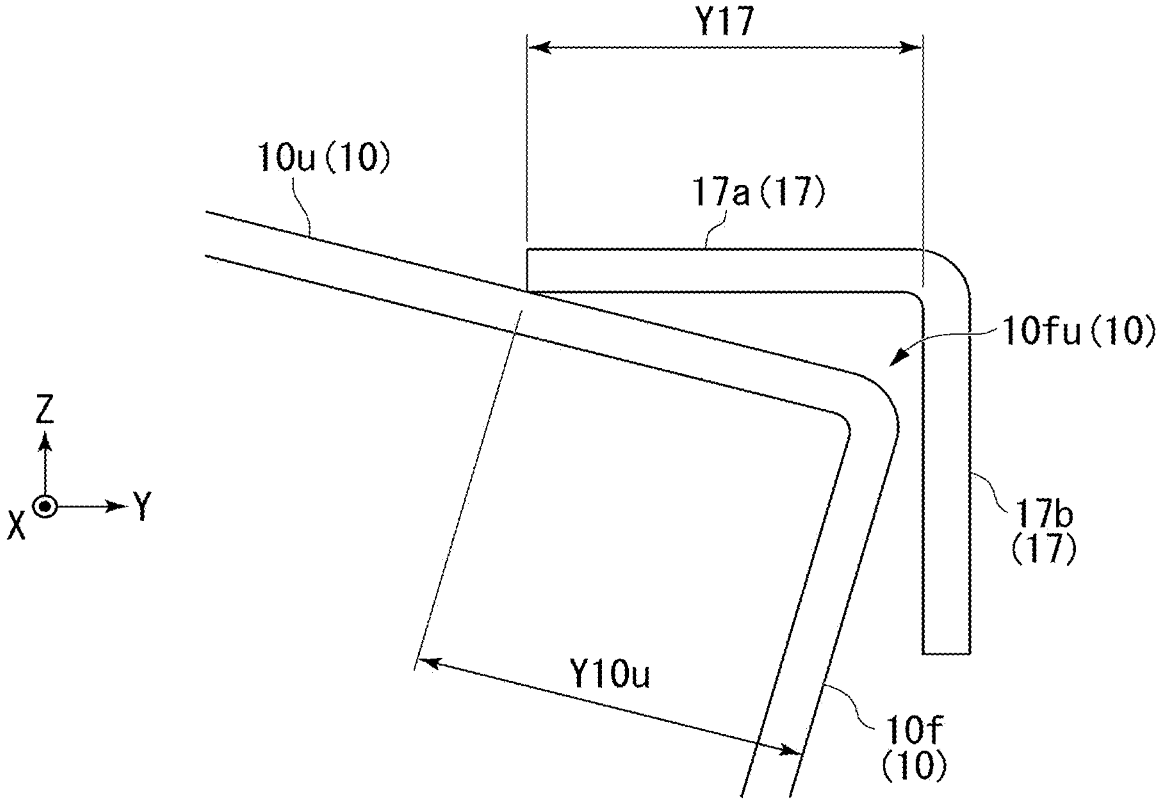
FIG. 6 is a side view showing a size and the like of an upper portion fixation panel and the unit in the control board of the embodiment.
Figure 7:
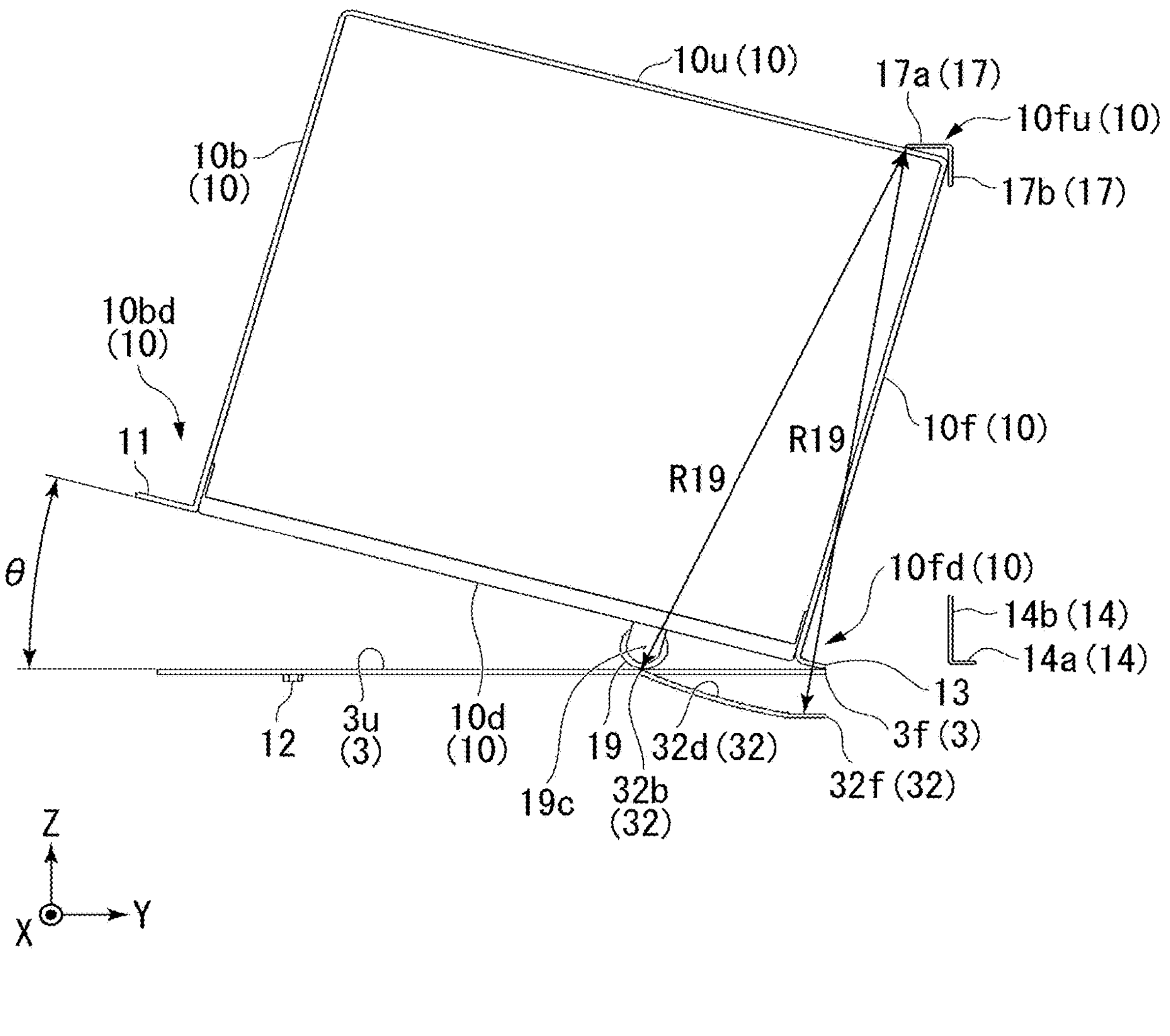
FIG. 7 is a side view showing a size and the like of the housing and the unit in the control board of the embodiment.

FIG. 4 is a side view showing a size and the like of the unit in the embodiment. FIG. 5 is a side view showing a size of the base panel and the like in the embodiment. FIG. 6 is a side view showing a size of the upper portion fixation panel and the unit in the embodiment. FIG. 7 is a side view showing a size of the unit, the base panel, and the like in the embodiment.

A Z-direction size of the unit 10 is a Z-direction height Z10 as shown in FIG. 4. A Z-direction size of the unit back plate 10*f* is the Z-direction height Z10. The Z-direction height Z10 is a Z-direction size from an upper surface of the unit upper plate 10*u* to a lower surface of the unit lower plate 10*d*.

A thickness of the back fixation plate 13 is a Z-direction thickness Z13 as shown in FIG. 4. A Y-direction size of the back fixation plate 13 is a Y-direction size Y13. The Y-direction size Y13 is a Y-direction size from a backside surface of the unit back plate 10*f* to a backside end of the back fixation plate 13. The Y-direction size Y13 is a Y-direction protrusion size of the back fixation plate 13.

A Z-direction height of the upper portion fixation panel 17 is a Z-direction height 217 as shown in FIG. 5. The Z-direction height 217 is a Z-direction distance from an upper surface 3*u* of the base panel 3 to a lower surface of the upper upward-downward position regulation section 17*a*.

A Z-direction height of the back position regulation portion 14 is a Z-direction height Z14 as shown in FIG. 5. The Z-direction height Z14 is a Z-direction distance from the upper surface 3*u* of the base panel 3 to a lower surface of the back upward-downward position regulation section 14*a*.

A Y-direction size Y17 of the upper portion fixation panel 17 is a Y-direction length of the upper upward-downward position regulation section 17*a* in the Y-direction as shown in FIG. 6. A Y-direction length of the upper upward-downward position regulation section 17*a* is a length from the front-side end 17*a*1 to a base end of the upper upward-downward position regulation section 17*a* in the Y-direction. A Y-direction length of the upper upward-downward position regulation section 17*a* is a length from the front-side end 17$a$1 to a front side surface of the upper forward-rearward position regulation section 17$b$ in the Y-direction.

A Y-direction position Y10$u$ of the unit 10 is a distance to an outer surface of the unit back plate 10$f$ from a position with which the front-side end 17$a$1 of the unit upper plate 10$u$ is in contact in the Y-direction as shown in FIG. 6.

A Y-direction attachment position of the caster 19 is defined by an angle θ as shown in FIG. 7. The angle θ is an angle formed by the upper surface 3$u$ and the unit lower plate 10$d$ in the following state in the base panel 3 and the unit 10. The angle θ is defined in a state where the backside upper end 10$fu$ of the unit 10 is in contact with the upper portion fixation panel 17 when the unit 10 is stored in the housing 2. The angle θ is defined in a state where the unit 10 is inclined such that the front-side lower end 10$bd$ floats from the base panel 3 in the Y-direction when the unit 10 is stored in the housing 2. The angle θ is defined in a state where the caster 19 is in contact with the front groove end 32$b$ when the unit 10 is stored in the housing 2. The angle θ is defined in a state where an end of the back fixation plate 13 is in contact with the back end portion 3$f$ of the base panel 3 when the unit 10 is stored in the housing 2. The angle θ is defined by the Y-direction size Y13.

Here, there are the following relationships.

$$Z10 \geq Z17$$

$$Z13 \geq Z14$$

$$Y10u = Y14$$

Further, in the upper portion fixation panel 17 and the guide groove 32, as shown in FIG. 7, a distance from the front-side end 17$a$1 to the front groove end 32$b$ is R19. A distance to a lower portion of the caster 19 in contact with the front groove end 32$b$ from a position of the upper surface of the unit upper plate 10$u$ with which the front-side end 17$a$1 is in contact in the unit 10 inclined at the angle θ is a distance R19. The distance R19 from the front-side end 17$a$1 to the front groove end 32$b$ is equal to the distance R19 to the lower portion of the caster 19 in contact with the front groove end 32$b$ from the position of the upper surface of the unit upper plate 10$u$ with which the front-side end 17$a$1 is in contact in the unit 10 inclined at the angle θ.

Further, the distance R19 from the front-side end 17$a$1 to the front groove end 32$b$ is equal to the distance R19 to the lower portion of the caster 19 in contact with the front groove end 32$b$ from the position of the upper surface of the unit upper plate 10$u$ with which the front-side end 17$a$1 is in contact.

The distance R19 from the front-side end 17$a$1 to the front groove end 32$b$ is equal to the distance R19 from the front-side end 17$a$1 to the back groove end 32$f$. The distance R19 from the front-side end 17$a$1 to an upper surface of the bottom portion 32$d$ is equal to the distance R19 from the front-side end 17$a$1 to the back groove end 32$f$.

The distance R19 from the front-side end 17$a$1 to the vicinity of the back groove end 32$f$ is equal to the distance R19 to the lower portion of the caster 19 in contact with the front groove end 32$b$ from the position of the upper surface of the unit upper plate 10$u$ with which the front-side end 17$a$1 is in contact.

Next, a storage method of the unit 10 in the housing 2 is described.

Figure 8:
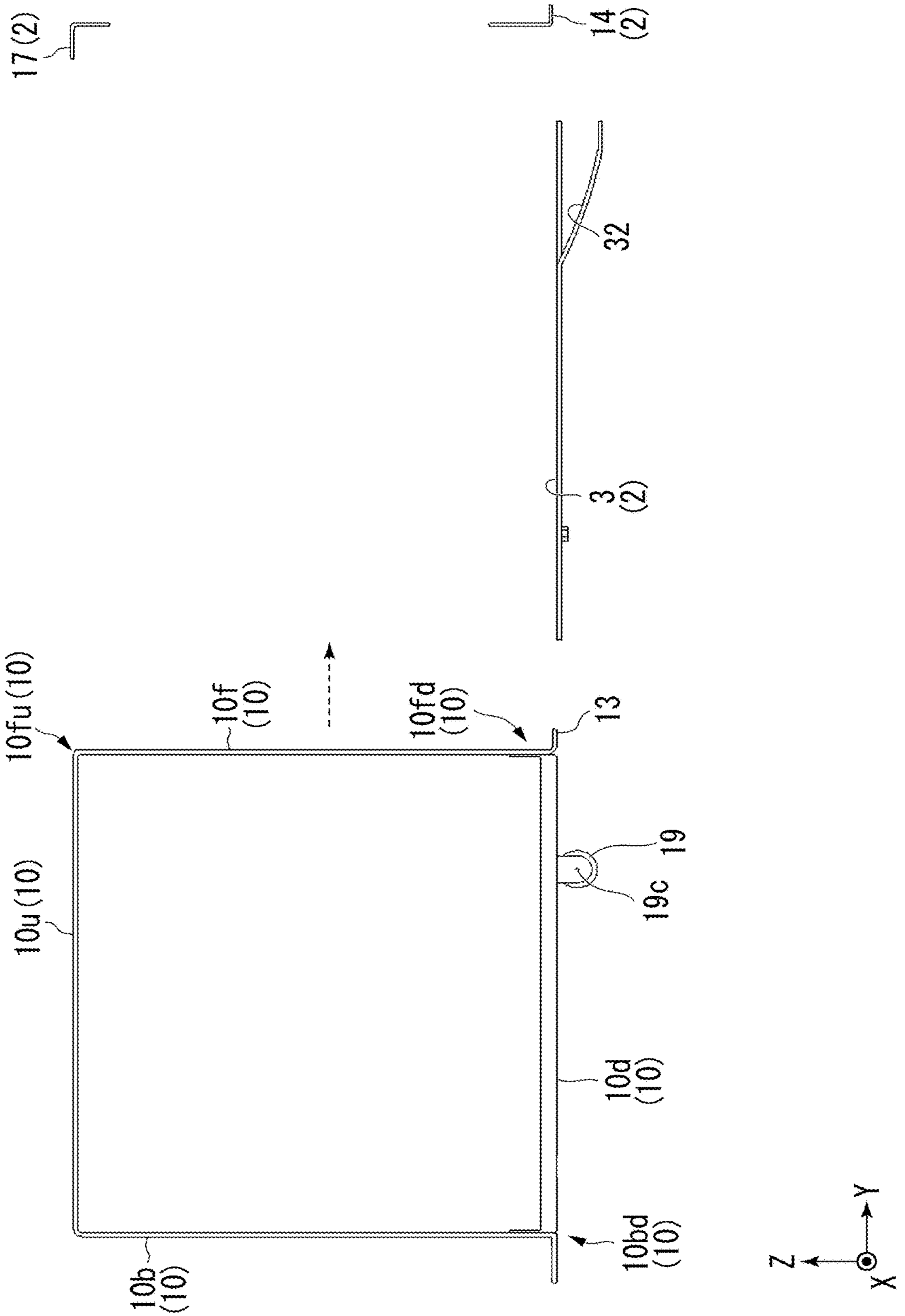
FIG. 8 is a side process view showing a storage method of the unit in the housing in the control board of the embodiment.
Figure 9:
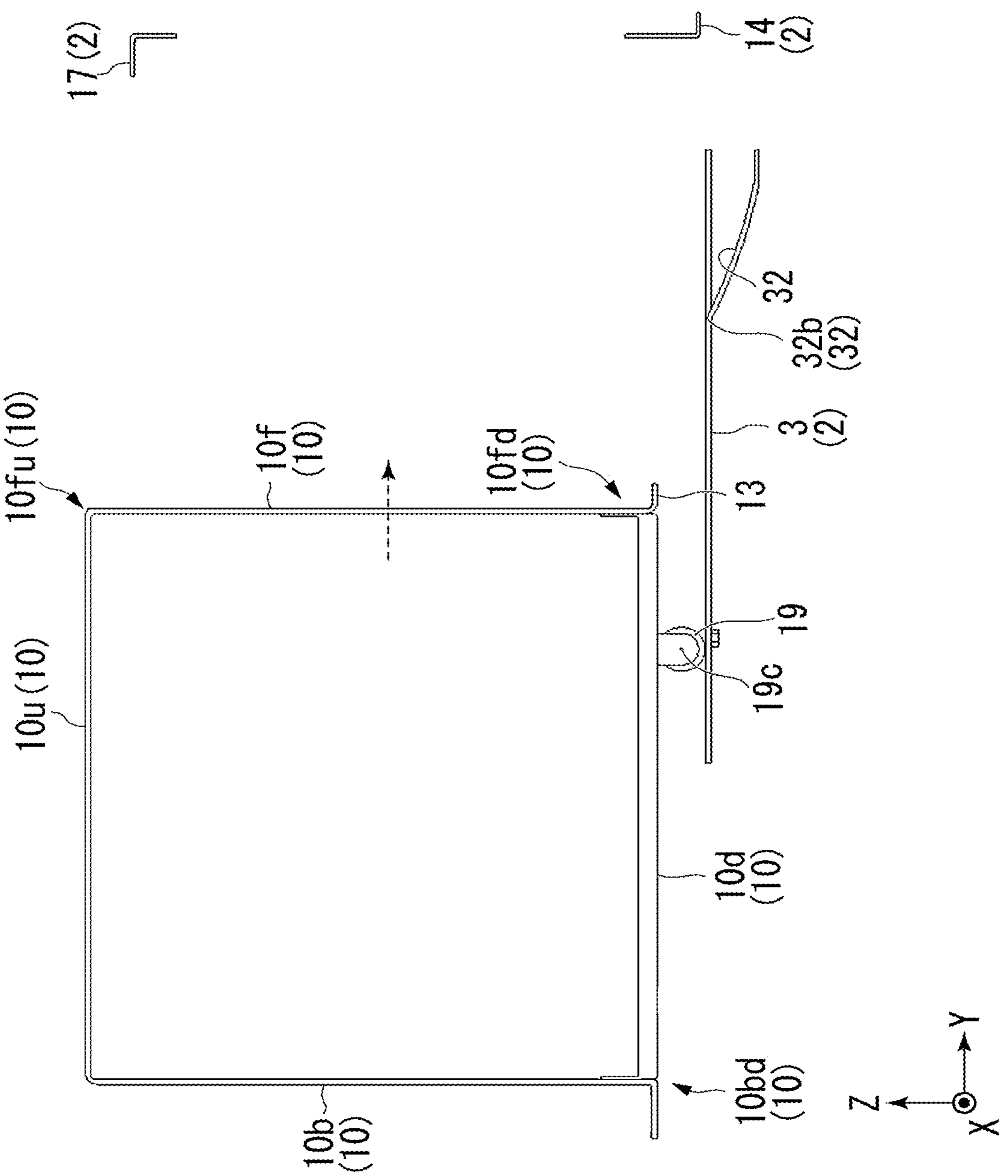
FIG. 9 is a side process view showing a storage method of the unit in the housing in the control board of the embodiment.
Figure 10:
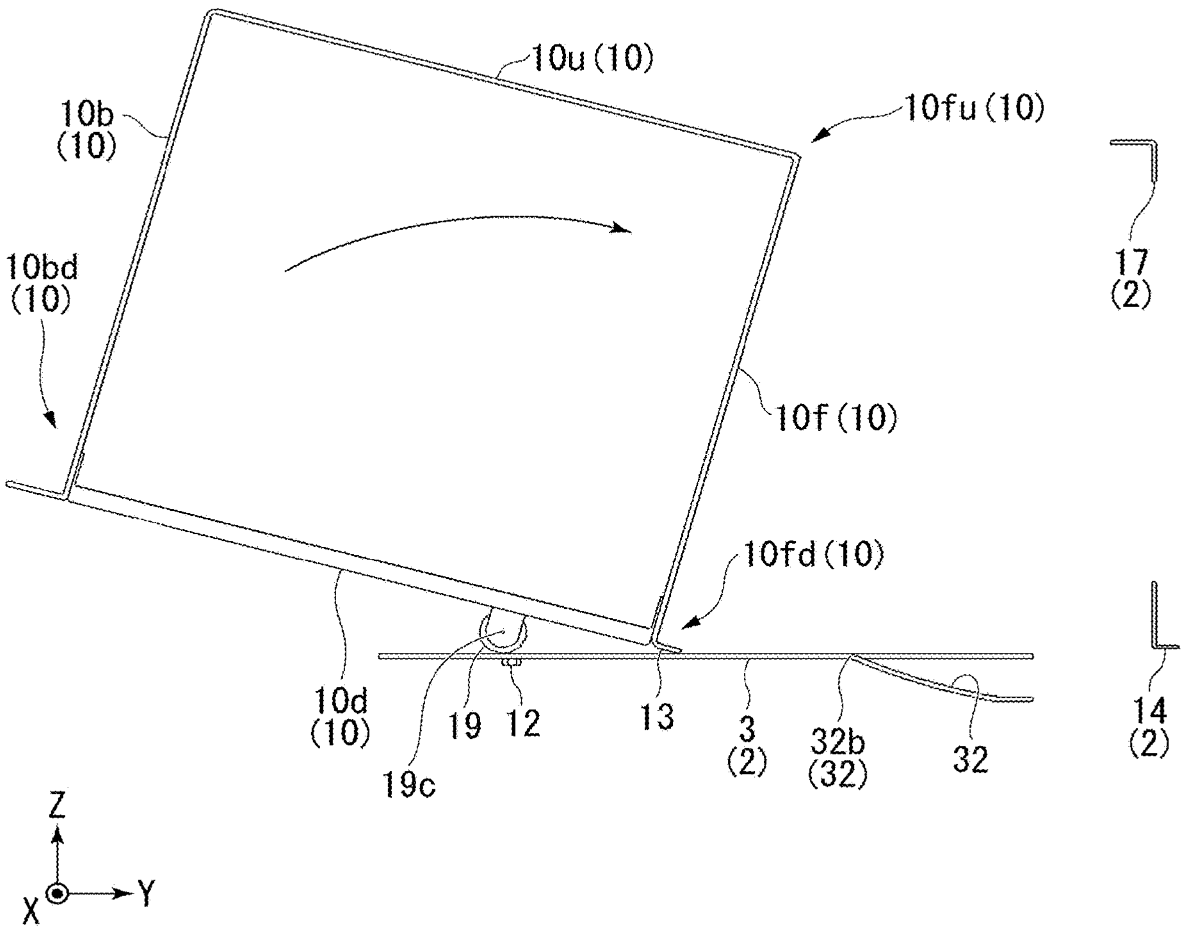
FIG. 10 is a side process view showing a storage method of the unit in the housing in the control board of the embodiment.
Figure 11:
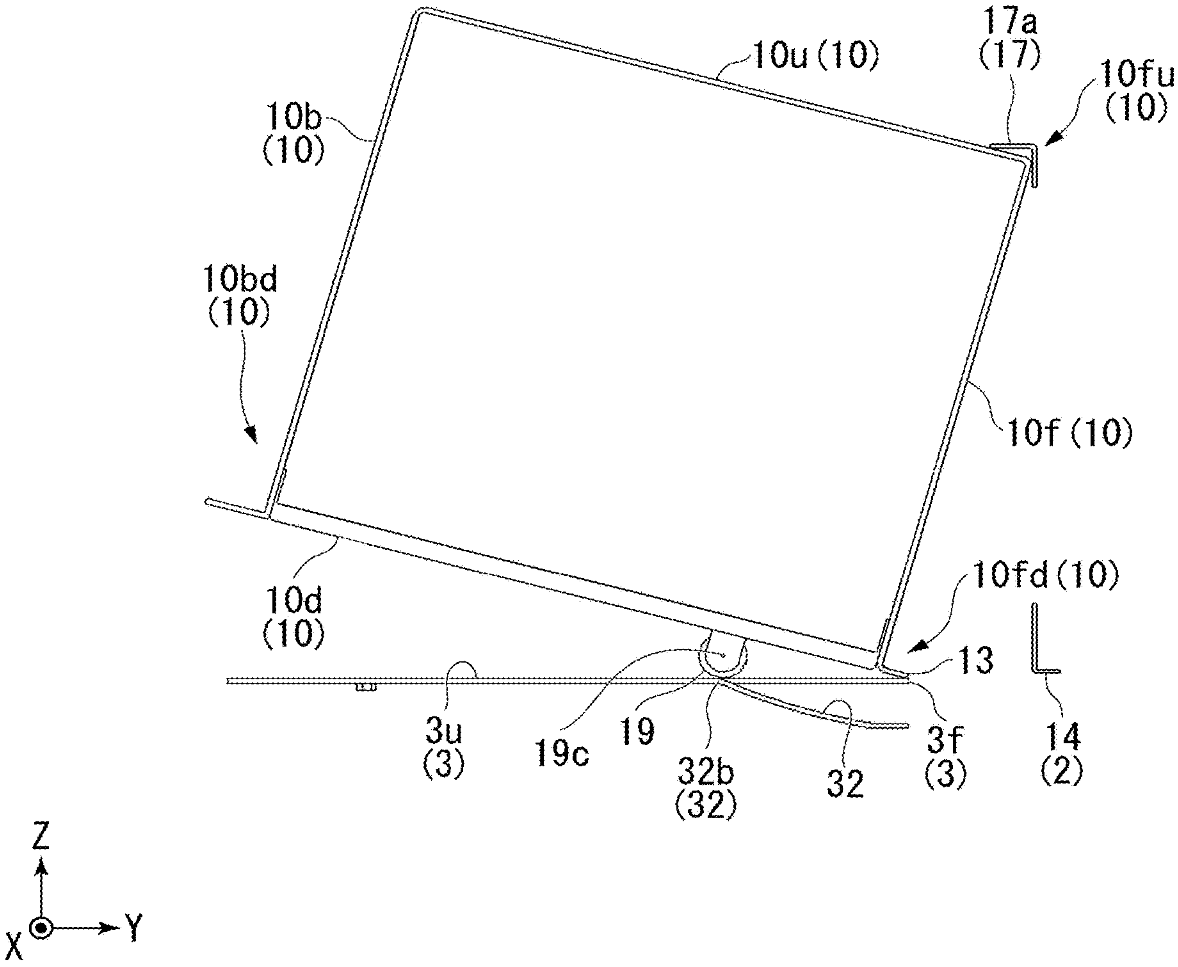
FIG. 11 is a side process view showing a storage method of the unit in the housing in the control board of the embodiment.
Figure 12:
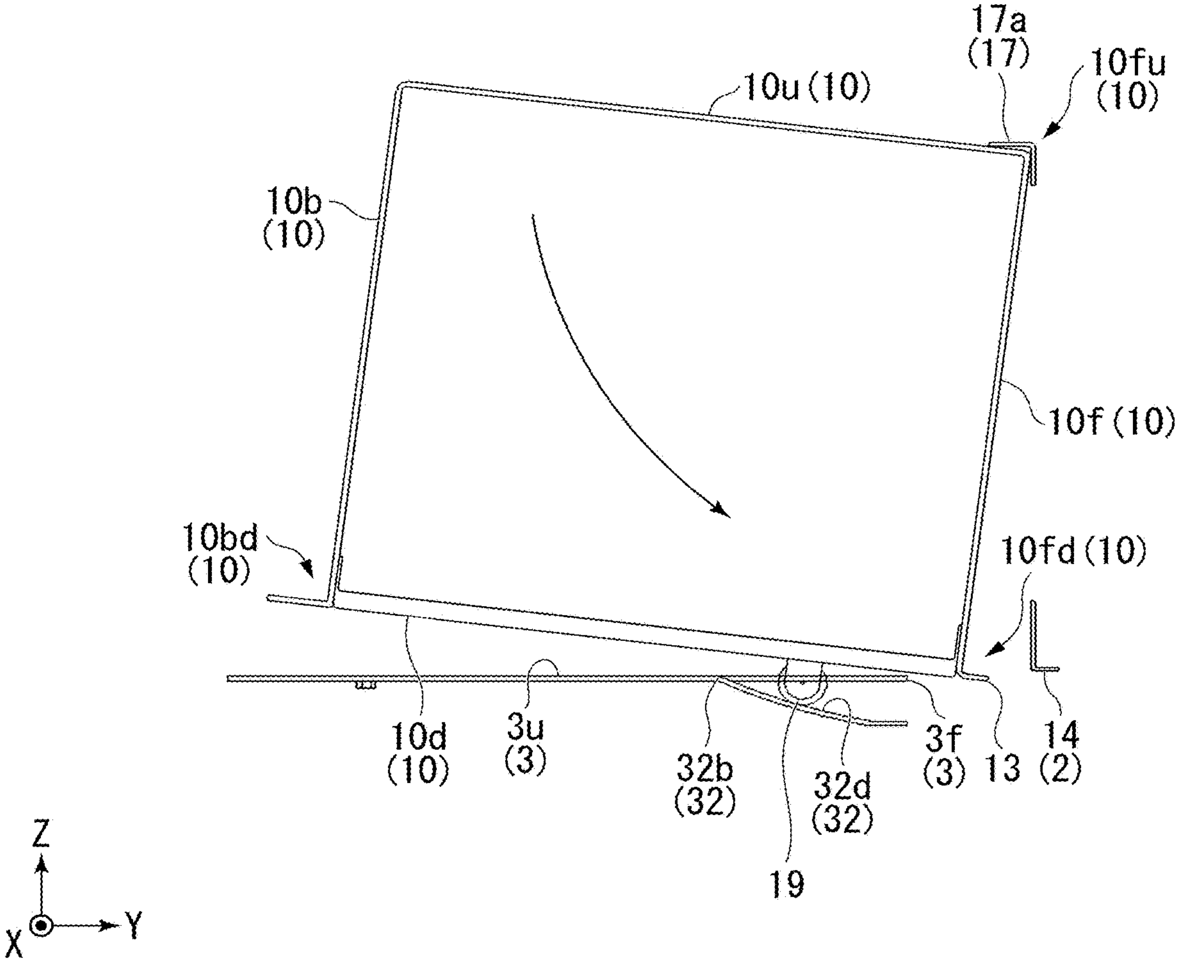
FIG. 12 is a side process view showing a storage method of the unit in the housing in the control board of the embodiment.

FIG. 8 is a process view showing a storage method of the unit in the embodiment. FIG. 9 is a process view showing the storage method of the unit in the embodiment. FIG. 10 is a process view showing the storage method of the unit in the embodiment. FIG. 11 is a process view showing the storage method of the unit in the embodiment. FIG. 12 is a process view showing the storage method of the unit in the embodiment.

When the unit 10 is stored in the housing 2, the unit 10 is prepared at a further front side in the Y-direction than the base panel 3 on which the unit 10 is mounted as shown in FIG. 8.

At this time, the unit 10 is located at an outer position of the housing 2 in the Y-direction, and the unit upper plate 10$u$ is located at a higher position than the unit lower plate 10$d$. The unit 10 is located at an outer position of the housing 2 in the Y-direction and a position where the unit back plate 10$f$ is closer to the base panel 3 than the unit front plate 10$b$. The unit 10 is located at an outer position of the housing 2 in the Y-direction and is in an attitude in which the rotation shaft 19$c$ is along the X-direction.

In the unit 10, a lower end of the caster 19 is at substantially the same height as the upper surface 3$u$ of the base panel 3. Alternatively, in the unit 10, the caster 19 is located at a higher position than the upper surface 3$u$ of the base panel 3.

In the unit 10, the unit upper plate 10$u$ and the unit lower plate 10$d$ are parallel to the base panel 3. Alternatively, in the unit 10, if the caster 19 is located at a higher position than the upper surface 3$u$ of the base panel 3, the unit upper plate 10$u$ and the unit lower plate 10$d$ may be inclined relative to the base panel 3.

Next, as shown in FIG. 9, the unit 10 is mounted on the upper surface 3$u$ of the base panel 3. In the unit 10, a lower end of the caster 19 comes into contact with the upper surface 3$u$ of the base panel 3.

In the unit 10, in the Y-direction, the lower end of the caster 19 comes into contact with the upper surface 3$u$ at a position spaced from the front groove end 32$b$. In the unit 10, the lower end of the caster 19 comes into contact with the upper surface 3$u$ at a further front side than the front groove end 32$b$ in the Y-direction. The unit 10 maintains the attitude in which the rotation shaft 19$c$ is along the X-direction.

In the unit 10, the unit upper plate 10$u$ and the unit lower plate 10$d$ are parallel to the base panel 3. Alternatively, in the unit 10, if the front fixation plate 11 and the back fixation plate 13 are not in contact with the upper surface 3$u$, the unit upper plate 10$u$ and the unit lower plate 10$d$ may be inclined relative to the base panel 3.

Further, in the unit 10, the caster 19 rotates around the rotation shaft 19$c$ and moves. The unit 10 moves toward the backside in the Y-direction along the upper surface 3$u$. At this time, the unit 10 maintains an attitude in which the front fixation plate 11 and the back fixation plate 13 are not in contact with the upper surface 3$u$. The unit 10 maintains the attitude in which the rotation shaft 19$c$ is along the X-direction.

In the unit 10, in the Y-direction, the lower end of the caster 19 does not reach the front groove end 32$b$.

Next, the unit 10 is inclined around the rotation shaft 19$c$ as shown by an arrow in FIG. 10. The unit 10 rotates in a direction in which the backside lower end 10$fd$ moves downward around the rotation shaft 19$c$. The unit 10 rotates in a direction in which the front-side lower end 10$bd$ moves upward around the rotation shaft 19$c$. In the unit 10, the front fixation plate 11 is spaced from the base panel 3 relative to the back fixation plate 13.

At this time, the unit 10 maintains the attitude in which the rotation shaft 19*c* is along the X-direction. The unit 10 maintains a state in which the back fixation plate 13 is not in contact with the upper surface 3*u*.

The unit 10 travels along the upper surface 3*u* until the lower end of the caster 19 reaches the front groove end 32*b* in the Y-direction. The unit 10 maintains the attitude in which the rotation shaft 19*c* is along the X-direction during traveling. The unit 10 maintains an attitude inclined around the rotation shaft 19*c* during traveling.

Next, the lower end of the caster 19 of the unit 10 reaches the front groove end 32*b* as shown in FIG. 11.

At the same time, the backside upper end 10*fu* of the unit 10 comes into contact with the upper portion fixation panel 17. The unit upper plate 10*u* of the unit 10 comes into contact with the upper upward-downward position regulation section 17*a*. In the upper upward-downward position regulation section 17*a*, the front-side end 17*a*1 in the Y-direction comes into contact with the unit upper plate 10*u*. A position in the upper surface of the unit upper plate 10*u* corresponding to the position Y10*u* that is a Y-direction distance from the back surface of the unit back plate 10*f* comes into contact with the front-side end 17*a*1.

At the same time, in the unit 10, the back fixation plate 13 reaches the back end portion 3*f*. Meanwhile, the unit 10 maintains the attitude in which the rotation shaft 19*c* is along the X-direction. The unit 10 maintains the attitude inclined around the rotation shaft 19*c*.

In the unit 10 and the base panel 3, the angle formed by the upper surface 3*u* and the unit lower plate 10*d* is the angle θ. The unit 01 and the base panel 3 maintain the angle θ. In the unit 10, the unit back plate 10*f* is not in contact with the upper forward-rearward position regulation section 17*b*.

In the unit 10, when the back fixation plate 13 reaches the back end portion 3*f* in a Z-direction view, each of both ends of the backside lower end 10*fd* in the X-direction comes into contact with the lateral position regulation section 14*c*.

In the lateral position regulation section 14*c*, in the Y-direction, the front-side end 14*cl* is closer to the front side of the housing 2 than the back end portion 3*f*. The back fixation plate 13 comes into contact with the front-side end 14*cl* prior to the back end portion 3*f*. The position in the X-direction of the back fixation plate 13 sandwiched between the two lateral position regulation sections 14*c* is regulated. In the unit 10, the backside lower end 10*fd* is sandwiched between the lateral position regulation sections 14*c*, and the position in the X-direction is regulated. The unit 10 in which the position is regulated in the X-direction is located at a position in which the caster 19 is capable of entering the inside of the guide groove 32.

Next, the unit 10 is inclined around a position in contact with the front-side end 17*a*1 as shown by an arrow in FIG. 12. The unit 10 rotates around the position in contact with the front-side end 17*a*1 such that the backside lower end 10*fd* is directed toward the backside in the Y-direction. The unit 10 rotates around the position in contact with the front-side end 17*a*1 such that the front-side lower end 10*bd* is directed downward in the Z-direction. The unit 10 rotates around the position in contact with the front-side end 17*a*1 such that the front-side lower end 10*bd* approaches the base panel 3.

At this time, the position of the unit upper plate 10*u* in contact with the front-side end 17*a*1 is not displaced. In the unit 10, the caster 19 enters the inside of the guide groove 32 beyond the front groove end 32*b*.

The caster 19 travels in the Y-direction along the bottom portion 32*d* inside the guide groove 32. The bottom portion 32*d* lowers from the front groove end 32*b* to the back groove end 32*f*. The caster 19 descends along the bottom portion 32*d*. In accordance with traveling of the caster 19, the unit 10 rotates around the position in contact with the front-side end 17*a*1. At the same time, in the unit 10, the front-side lower end 10*bd* moves in a diagonal direction that is directed downward in the Z-direction and toward the backside in the Y-direction. In the unit 10, the backside lower end 10*fd* moves in the diagonal direction that is directed downward in the Z-direction and toward the backside in the Y-direction.

Figure 13:
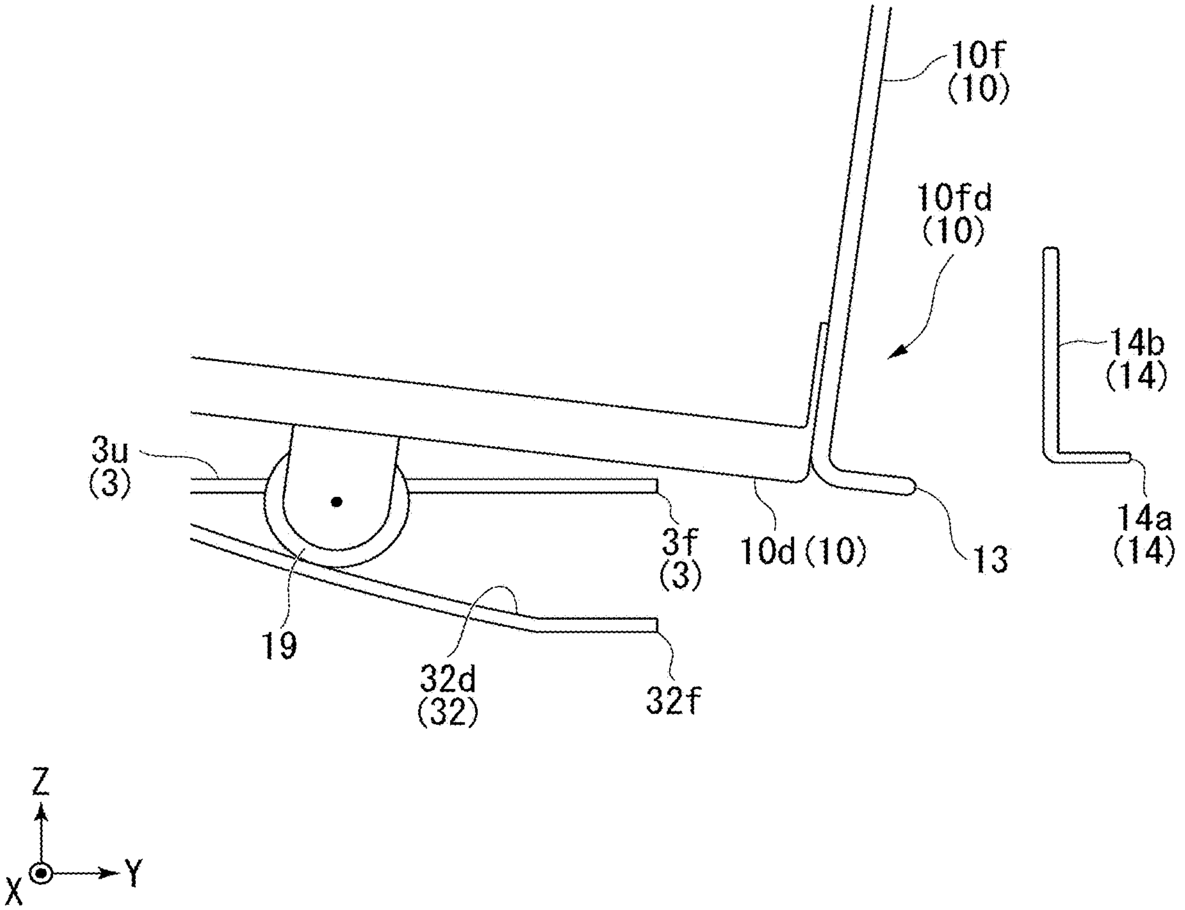
FIG. 13 is a side process view showing a storage method of the unit in the housing in the control board of the embodiment.

At this time, as shown in FIG. 13, the unit 10 maintains a state in which the lower surface of the unit lower plate 10*d* is spaced from the back end portion 3*f*. The movement of unit 10 is not blocked by the base panel 3.

The unit 10 rotates around the position in contact with the front-side end 17*a*1 and reaches a storage position as shown in FIG. 2. At the storage position, in the backside lower end 10*fd*, the unit back plate 10*f* is in contact with the back forward-rearward position regulation section 14*b*. In the backside lower end 10*fd*, an upper surface of the back fixation plate 13 is in contact with a lower surface of the back upward-downward position regulation section 14*a*. The upper surface of the back fixation plate 13 is pressed against the lower surface of the back upward-downward position regulation section 14*a*. In the backside lower end 10*fd*, the back fixation plate 13 and the back upward-downward position regulation section 14*a* are elastically deformed. The back fixation plate 13 and the back upward-downward position regulation section 14*a* are fixed by a frictional force generated by the elastic deformation and provide an anti-vibration effect in a direction along the XY plane.

At the storage position, in the backside upper end 10*fu*, the unit back plate 10*f* is in contact with the upper forward-rearward position regulation section 17*b*. In the backside upper end 10*fu*, the unit upper plate 10*u* is in contact with the upper upward-downward position regulation section 17*a*. In the backside upper end 10*fu*, the unit upper plate 10*u* is pressed by the upper upward-downward position regulation section 17*a*. The upper upward-downward position regulation section 17*a* of the backside upper end 10*fu* is elastically deformed. The upper upward-downward position regulation section 17*a* is fixed by a frictional force generated by the elastic deformation and provides an anti-vibration effect in a direction along the XY plane.

At the storage position, in the front-side lower end 10*bd*, the unit lower plate 10*d* is in contact with the upper surface 3*u*. The entire region to the back end portion 3*f* in the Y-direction of the lower surface of the unit lower plate 10*d* is in contact with the upper surface 3*u*.

The penetration portion 11*s* is at a position that matches the penetration portion 3*s*. The bolt 12 is inserted through the penetration portion 11*s* and the penetration portion 3*s*, and the unit 10 is fixed to the base panel 3.

By tightening the bolt 12, a force is applied to the unit 10 such that the front-side lower end 10*bd* approaches the base panel 3. Thereby, a pressing force in the upper surface of the unit upper plate 10*u* and the lower surface of the upper upward-downward position regulation section 17*a* is increased. Further, a pressing force in the upper surface of the back fixation plate 13 and the lower surface of the back upward-downward position regulation section 14*a* is increased.

Thereby, the storage of the unit 10 in the housing 2 is completed.

When removing the stored unit 10 from the housing 2, the storage method described above is performed in a reverse sequence.

The control board 1 of the embodiment can make it unnecessary to fix the bolt at the backside while maintaining an anti-vibration structure. Thereby, the unit 10 can be sufficiently fixed by fitting the unit 10 to a space among the base panel 3, the back position regulation portion 14, and the upper portion fixation panel 17 of the housing 2. At the same time, the upper surface of the back fixation plate 13 is in contact with the lower surface of the back upward-downward position regulation section 14*a*, and thereby, the unit 10 can be sufficiently fixed.

The control board 1 can maintain the angle θ of the unit 10 to the base panel 3 by the caster 19. The control board 1 can improve the movement performance of the unit 10 relative to the base panel 3 by the caster 19. The control board 1 can facilitate the fixation of the unit 10 to the base panel 3 by the caster 19.

The control board 1 can increase the distance between a fulcrum point and a force point when fixing the unit 10 compared to the conventional one. It is also possible to provide a side plate on a side surface of the unit 10 and close the side surface of the unit 10.

Although the control board 1 has been described using a configuration in which one caster 19 corresponds to one guide groove 32, a guide groove 32 corresponding to a plurality of casters 19 can also be formed on the base panel 3.

By providing the caster 19 on the unit lower plate 10*d*, the control board 1 can easily maintain the angle θ with the base panel 3. Further, by changing the position where the caster 19 is provided on the unit lower plate 10*d* in the Y-direction, the angle θ can be easily set. The angle θ can be easily set by changing the Y-direction length Y13 of the back fixation plate 13.

In the control board 1, by causing the unit 10 to travel, then pushing the unit 10, and rotating the front-side lower end 10*bd* in a downward direction in a state where the front-side end 14*a*1 of the upper portion fixation panel is in contact with the unit 10, the unit 10 can be easily set to the storage position.

When the control board 1 is applied to an electric power conversion device, even when the housing 2 is downsized, or internal items are mounted at high density, a tool is not required. The control board 1 can prevent a problem in which it is impossible to cause the tool to enter the back. Further, it is not necessary to fix the rear portion of the unit 10 by a bolt or the like at the inside of the housing 2. Furthermore, it is possible to sufficiently perform the fixation of the unit 10 to the housing 2.

Accordingly, it is possible to prevent possibilities that a component inside the unit 10, and an electric conductor, a cable, or the like connected to the unit 10 may be damaged by vibration generated during transportation, during device operation, or the like.

At the same time, it is possible to perform the fixation of the unit 10 to the housing 2 without using a special tool. Since a special tool is not used, the number of components is not increased, and costs are not increased.

Further, substrates, items, and the like are heavy. The unit 10 is heavy. However, the control board 1 can improve ease and workability in taking the unit 10 in and out of the housing 2. At the same time, it is possible to shorten working hours in taking the unit 10 in and out of the housing 2.

The control board 1 can improve the fixation performance of the unit 10 to the housing 2. The control board 1 enables the fixation of the unit 10 without using a special tool at the inside of the housing 2. The control board 1 can improve ease in attaching the unit 10 to the housing 2. The control board 1 can improve workability in attaching the unit 10 to the housing 2. The control board 1 can shorten working hours in attaching the unit 10 to the housing 2. The control board 1 can provide a configuration corresponding to a flexible item arrangement in attaching the unit 10 to the housing 2.

By increasing a friction coefficient of surfaces that are in contact with each other in the upper surface of the unit upper plate 10*u* and the lower surface of the upper upward-downward position regulation section 17*a*, the control board 1 can strongly fix the unit 10 by the housing 2. Thereby, it is possible to improve the anti-vibration effect.

In order to increase the friction coefficient between the upper surface of the unit upper plate 10*u* and the lower surface of the upper upward-downward position regulation section 17*a*, a predetermined surface treatment can be performed on the upper surface of the unit upper plate 10*u* and the lower surface of the upper upward-downward position regulation section 17*a*. In order to increase the friction coefficient, the upper surface of the unit upper plate 10*u* and the lower surface of the upper upward-downward position regulation section 17*a* can be formed of a material having a large friction coefficient.

By increasing a friction coefficient of surfaces that are in contact with each other in the upper surface of the back fixation plate 13 and the lower surface of the back upward-downward position regulation section 14*a*, the control board 1 can strongly fix the unit 10 by the housing 2. Thereby, it is possible to improve the anti-vibration effect.

In order to increase the friction coefficient between the upper surface of the back fixation plate 13 and the lower surface of the back upward-downward position regulation section 14*a*, a predetermined surface treatment can be performed on the upper surface of the back fixation plate 13 and the lower surface of the back upward-downward position regulation section 14*a*. In order to increase the friction coefficient, the upper surface of the back fixation plate 13 and the lower surface of the back upward-downward position regulation section 14*a* can be formed of a material having a large friction coefficient.

By increasing a friction coefficient of surfaces that are in contact with each other in the lower surface of the unit lower plate 10*d* and the upper surface 3*u* of the base plate 3, the control board 1 can strongly fix the unit 10 by the housing 2. Thereby, it is possible to improve the anti-vibration effect.

In order to increase the friction coefficient between the lower surface of the unit lower plate 10*d* and the upper surface 3*u* of the base plate 3, a predetermined surface treatment can be performed on the lower surface of the unit lower plate 10*d* and the upper surface 3*u* of the base plate 3. In order to increase the friction coefficient, the lower surface of the unit lower plate 10*d* and the upper surface 3*u* of the base plate 3*a* can be formed of a material having a large friction coefficient.

DESCRIPTION OF THE REFERENCE SYMBOLS

1 Control board
2 Housing
3 Base panel
10 Unit
10*fd* Backside lower end
10*fu* Backside upper end

14 Back position regulation portion (unit fixation portion)
17 Upper portion fixation panel
19 Caster
32 Guide groove
**32*d*** Bottom portion (bottom plate)

The invention claimed is:

1. A control board comprising:

a housing;

a unit that is provided on a base panel in the housing;

a caster that is provided on a bottom portion of the unit and is capable of traveling on the base panel;

an upper portion fixation panel that fixes a backside upper end of the unit at a time of storing the unit;

a guide groove that regulates a movement of the caster such that the unit is lowered to a fixation position toward a back side at the time of storing the unit; and a unit fixation portion that fixes a backside lower end of the unit when an entire lower surface region of the unit comes into contact with the base panel.

2. The control board according to claim 1, wherein the upper portion fixation panel is provided at a position with which the backside upper end of the unit first comes into contact in moving the unit inclined such that a front-side lower end floats from the base panel toward the back side while supporting the unit by the caster at the time of storing the unit.

3. The control board according to claim 2, wherein the guide groove is provided on the base panel and regulates a movement locus of the caster such that the backside lower end of the unit rotates toward the back side around a position in contact with the upper portion fixation panel.

4. The control board according to claim 3, wherein the guide groove has a curve shape that lowers from the base panel toward the back side around the position in contact with the upper portion fixation panel.

5. The control board according to claim 4, wherein a front side of a bottom plate of the guide groove is integral with the base panel, and the bottom plate is formed to be bent downward from the base panel.

* * * * *